United States Patent [19]

Nishitani et al.

[11] Patent Number: 5,300,755
[45] Date of Patent: Apr. 5, 1994

[54] STRUCTURE FOR WELDING ELECTRICAL CONNECTING PORTIONS TO EACH OTHER USING LASER LIGHT BEAM

[75] Inventors: Keizo Nishitani; Masuo Sugiura; Isao Takiguchi; Tetsurou Saimoto, all of Shizuoka, Japan

[73] Assignee: Yazaki Corporation, Tokyo, Japan

[21] Appl. No.: 925,646

[22] Filed: Aug. 7, 1992

[30] Foreign Application Priority Data

Aug. 12, 1991 [JP] Japan .................. 3-201737

[51] Int. Cl.$^5$ .......................................... B23K 26/00
[52] U.S. Cl. ......................... 219/121.63; 219/121.64; 338/329
[58] Field of Search ................ 219/121.63, 121.64; 439/874; 29/860; 338/322, 324, 325, 328, 329

[56] References Cited

U.S. PATENT DOCUMENTS

| | | | |
|---|---|---|---|
| 3,610,874 | 10/1971 | Gagliano | 219/121.64 |
| 3,665,367 | 5/1972 | Keller et al. | 339/275 T |
| 4,889,275 | 12/1989 | Mullen, III et al. | 228/180.2 |
| 4,966,565 | 10/1990 | Dohi | 439/874 |
| 4,978,835 | 12/1990 | Luijtjes et al. | 219/121.64 |
| 5,055,652 | 10/1991 | Jones et al. | 219/121.64 |
| 5,164,566 | 11/1992 | Spletter et al. | 219/121.63 |

FOREIGN PATENT DOCUMENTS

| | | |
|---|---|---|
| 48-103438 | 12/1973 | Japan . |
| 57-153419 | 9/1982 | Japan . |
| 59-78787 | 5/1984 | Japan . |
| 60-210383 | 10/1985 | Japan . |

OTHER PUBLICATIONS

Patent Abstracts Of Japan, vol. 11, No. 360 (M-645) (2807) Nov. 25, 1987 (JP-A-62 137 174).

Primary Examiner—C. L. Albritton
Attorney, Agent, or Firm—Sughrue, Mion, Zinn, Macpeak & Seas

[57] ABSTRACT

An arrangement and method for establishing an electrical and mechanical connection between electrically conductive members. The arrangement includes an electrically conductive connecting member, two electrically conductive metallic members disposed opposite each other, flanking the connecting member, and clamping the connecting member therebetween, and a source of laser energy oriented such that an output beam therefrom is incident on an outer surface of one of the metallic members and directed towards the underlying connecting member to establish a weld connection at zones of mutual contact between the connecting member and the respective metallic members. The connecting member includes a cable or the like and the metallic members include contact terminals, busbars or the like. In the method, the connecting member is positioned between the metallic members and the output beam is radiated on one of the metallic members in the direction of the connecting member so as to weld the connecting member to the metallic members.

19 Claims, 8 Drawing Sheets

STRUCTURE FOR WELDING ELECTRICAL CONNECTING PORTIONS TO EACH OTHER USING LASER LIGHT BEAM

BACKGROUND OF THE INVENTION

1. Field of the Invention

The present invention relates to a structure and method for firmly and electrically welding an electrically conductive connecting member, such as a sheathed conductor having a small diameter, a flexible printed wiring board or the like, to an electrically conductive metallic member, such as a terminal, a busbar or the like, by using a laser light beam.

2. Background

Figure 17:
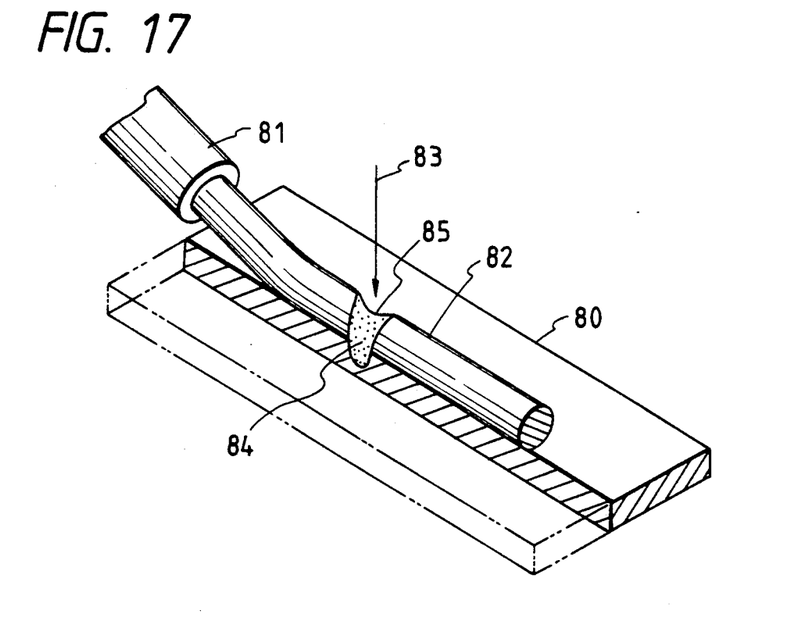
FIG. 17 is a perspective view of a conventional structure wherein a sheathed cable is welded using laser light beam and a part of a sheath is removed therefrom.

FIG. 17 is a perspective view of a conventional structure employable for welding electrical connecting portions to each other using a laser light beam.

Figure 18:
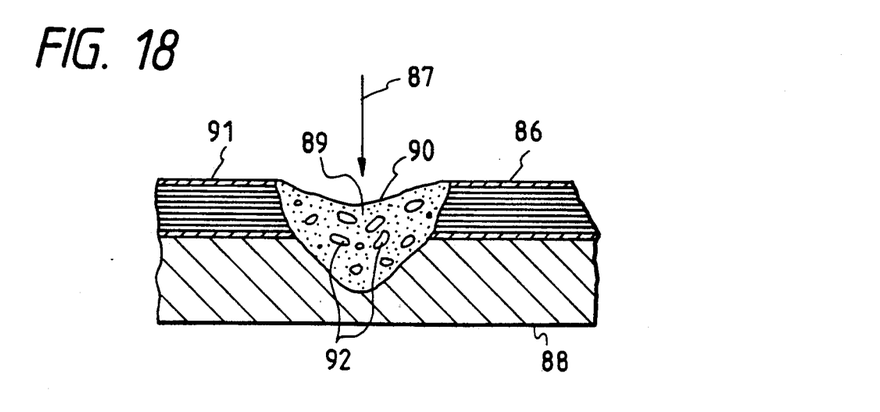
FIG. 18 is a vertical sectional view of a conventional structure wherein a sheathed conductor is welded using a laser light beam.

This conventional structure is designed such that a conductor portion (consisting of a bundle of lead wires) 82 of a sheathed cable 81 is placed on the surface of an electrically conductive metallic plate 80 such as a terminal, a busbar or the like and a laser beam 83 is irradiated on the conductor portion from above so as to weld the conductor portion 82 to the electrically conductive metallic plate 80. Referring to FIG. 18, when a polyurethane sheathed conductor 86, having a small diameter, is connected to an electrically conductive metallic plate 88, a laser light beam 87 is irradiated directly on the sheathed conductor 86 Without the sheath 91 peeled away therefrom.

With the conventional structures mentioned above, there arises a problem in that the welded portion 84, 89 of the cable 81, 86 is largely recessed as illustrated by reference numeral 85, 90, causing the tensile strength of cable 81, 86 to be remarkably reduced. Moreover, in the case where the sheathed conductor 86 is welded directly to the electrically conductive metallic plate 88 as shown in FIG. 18, vapor resulting from vaporization of the sheath part 89 generates a number of voids, or bubbles, 92 which in turn cause a substantial reduction of the strength of the welded structure.

SUMMARY OF THE INVENTION

The present invention has been made with the following background in mind and its object resides in providing a structure and method for firmly welding an electrically conductive metallic plate, such as a terminal, busbar or the like, using laser light beam without the formation of a recessed portion at the welded part and the generation of voids.

To accomplish the above object, the present invention provides a structure for welding electrical connecting portions to each other using laser light beam, wherein the structure is characterized in that an electrically conductive member such as a cable, a flexible printing circuit board or the like is clamped between electrically conductive metallic members located opposite to each other so that the electrically conductive connecting member is welded to the electrically conductive metallic members by irradiating laser light beam to one of the electrically conductive metallic members from above while being oriented toward the electrical connecting member.

As the laser light beam is irradiated, one of the electrically conductive metallic member becomes molten, causing the inner electrically conductive connecting member and the other electrically conductive metallic member to be heated, whereby the three members are welded to each other. Since the laser light beam is not irradiated directly on the electrically conductive connecting member, there does not arise the problems discussed above concerning the welded portion becoming recessed or generating the voids. Thus, the strength of the welded structure is remarkably increased. When a disconnecting force is applied to the electrically conductive connecting member, the connecting member counteracts the disconnecting force by bending at the opposite edge portions of the connecting member. Therefore, the disconnecting force is not imparted directly to the welded part, resulting in the strength of the welded structure against the disconnecting force being improved.

DETAILED DESCRIPTION OF THE PREFERRED EMBODIMENTS

Figure 1:
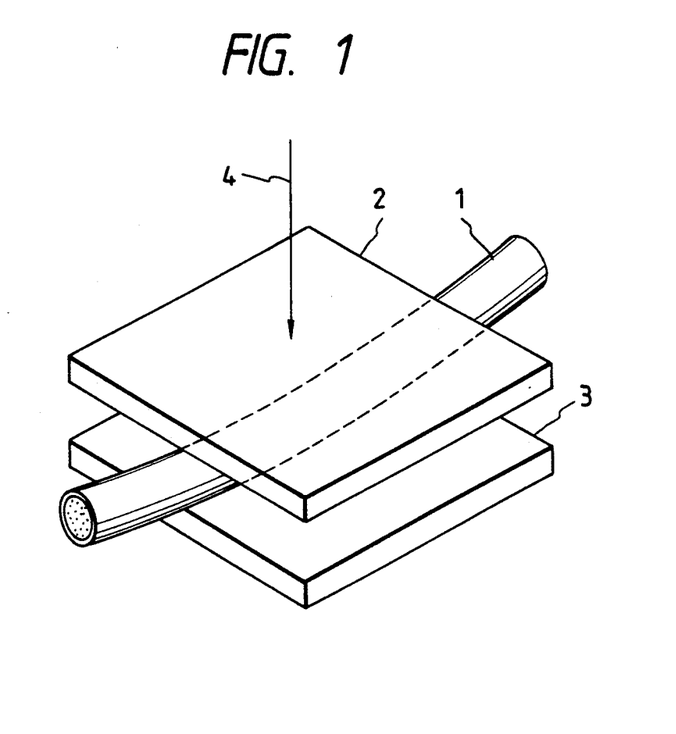
FIG. 1 is a perspective view of a welded structure, particularly illustrating a basic technical concept of welding electrical connecting portions to each other using a laser light beam in accordance with the present invention.

FIG. 1 is a perspective view illustrating a structure designed for welding electrical connecting portions to each other using a laser light beam, according to the present invention.

This structure is embodied such that a sheathed conductor 1, having a small diameter of 1 mm or less, is clamped between two electrically conductive metallic plates 2 and 3 such as terminals, busbars or the like. Thereafter, a laser light beam is directed toward the central axis of the conductor 1 so as to be irradiated onto the upper metallic plate in a perpendicular direction. As a result, the sheathed conductor 1 and the electrically conductive metallic plates 2 and 3 are welded to each other. Each of the electrically conductive metallic plates 2 and 3 is made of a metallic material which is compatible to the sheathed conductor e.g., a phosphor bronze, a beryllium copper or the like.

Figure 2:
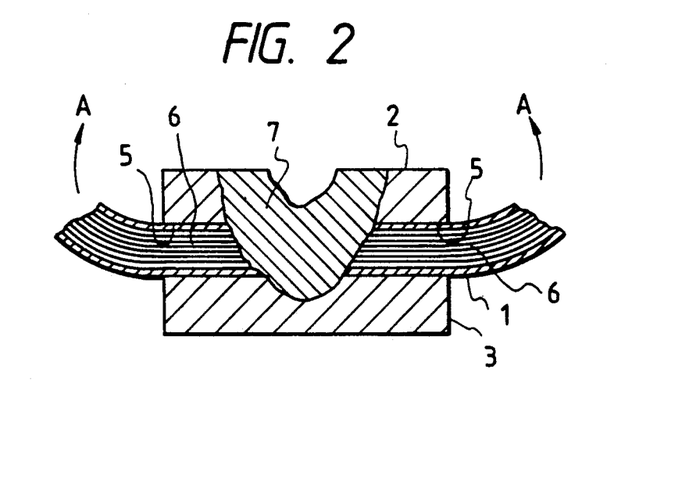
FIG. 2 is a vertical sectional view of the welded structure, particularly illustrating the welded state of the welded structure shown in FIG. 1.

With this construction, the upper metallic plate 2 is molten and develops a recessed portion, as shown in FIG. 2. Simultaneously, the sheathed conductor 1 and the lower conductive metallic plate 3 are heated together so that the sheathed conductor 1 is firmly welded to the upper and lower electrically conductive metallic plates 2 and 3 without the formation of any recessed portion in the conductor such that the diameter of the conductor is not reduced.

Table 1 shows results obtained from tests conducted for measuring the strength of the welded conductor 1, as seen in the pulling direction. As is apparent from the table, the average value X of the tensile strength of the conductor alone is 3.1 Kgf, the average value of the tensile strength of the conventional connecting structure, discussed above and illustrated in FIGS. 17 and 18, is only 1.2 Kgf, and the average value of tensile strength of the structure of the present invention is a relatively high 2.9 Kgf. In addition, the average deviation $\sigma$ of the conventional structure is 0.17 Kgf and that of the structure of the present invention is 0.07 Kgf, which is less than half of the average deviation of the conventional structure. Accordingly, the structure of the present invention is more uniform in respect to tensile strength.

TABLE 1

|  | Tensile Strength of Conductor Itself (Kgf) | Welded Strength of Conventional Structure (Kgf) | Welded Strength of Structure of the Present Invention (Kgf) |
|---|---|---|---|
| No. 1 | 3.17 | 1.27 | 2.95 |
| No. 2 | 3.10 | 1.46 | 2.73 |
| No. 3 | 3.15 | 1.02 | 2.94 |
| No. 4 | 3.15 | 1.56 | 3.00 |
| No. 5 | 3.15 | 1.21 | 2.96 |
| No. 6 | 3.01 | 1.08 | 2.94 |
| No. 7 | 3.21 | 1.17 | 2.89 |
| No. 8 | 3.16 | 1.05 | 2.94 |
| No. 9 | 3.15 | 1.30 | 2.92 |
| No. 10 | 3.13 | 1.11 | 2.99 |
| X | 3.138 | 1.223 | 2.926 |
| $\sigma$ n | 0.050 | 0.169 | 0.072 |

Figure 3:
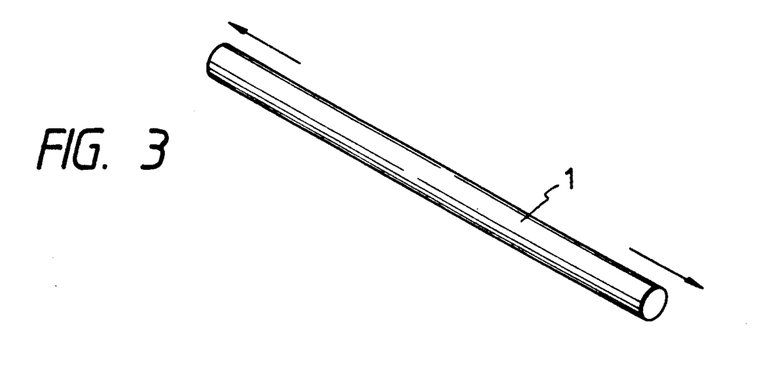
FIG. 3 is a perspective view schematically illustrating a method of testing the tensile strength of a cable.
Figure 4:
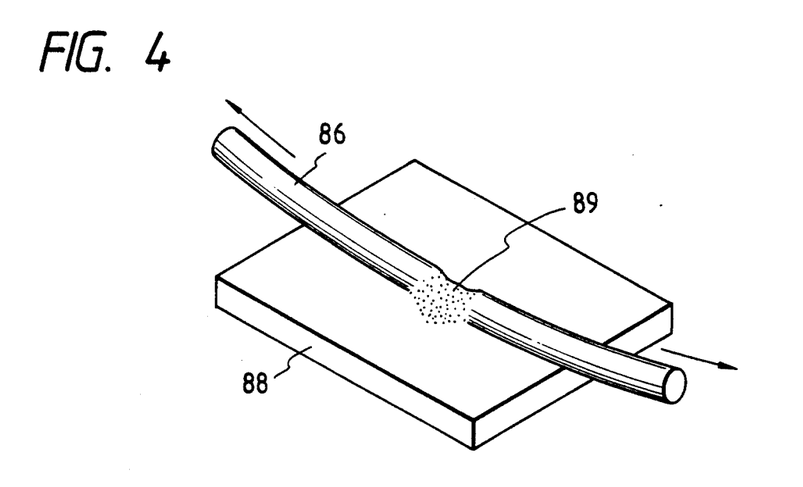
FIG. 4 is a perspective view schematically illustrating a method of testing the tensile strength of the conventional structure discussed above.
Figure 5:
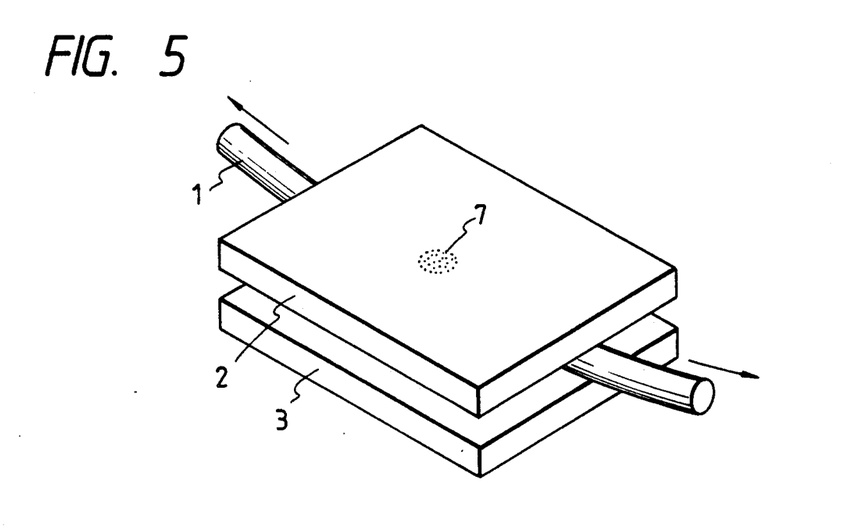
FIG. 5 is a perspective view schematically illustrating a method of testing the tensile strength of a cable connecting structure in accordance with the present invention.

Measuring methods employed for the aforementioned measurements are schematically illustrated in FIG. 3 through FIG. 5. FIG. 3 shows a tensile test for measuring a tensile strength of the conductor 1 alone, FIG. 4 shows a tensile test for measuring a tensile strength of the conventional welded structure, and FIG. 5 shows a tensile test for measuring a tensile strength of the welded structure of the present invention.

When a certain disconnecting force is exerted on the sheathed conductor 1 in the disconnecting direction as represented by arrow A in FIG. 2, the sheathed conductor 1 is bent around the edge portions 5 of the upper electrically conductive metallic plate 2 so that a direct tensile force is not applied to the portions 6. Thus, any applied force is not exerted directly on the welded part 7, resulting in the strength of the welded structure against the disconnecting force being improved.

Figure 6:
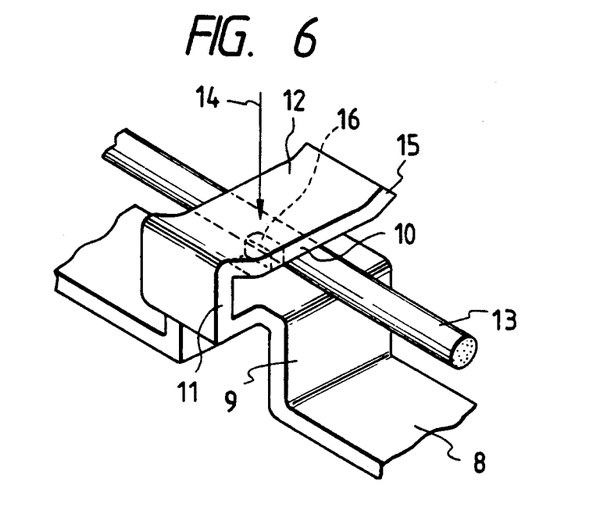
FIG. 6 is a perspective view illustrating a first embodiment of the present invention.

FIG. 6 is a perspective view of a structure employable for welding electrical connecting portions to each other in accordance with a first embodiment of the present invention wherein a sheathed conductor is welded to a busbar. This structure is embodied such that a projecting portion 9 is formed at the intermediate portion of a busbar 8, and a resilient clamping piece 12 is formed by forwardly bending a projection piece 11 extending upright from an upper wall 10 of the bent portion 9 so as to clamp a sheathed conductor 13 between the clamping piece 12 and the upper wall 10 of the bent portion 9. The clamping piece 12, the sheathed conductor 13, and the upper wall 10 are welded to each other by irradiating a laser light beam 14 on the clamping piece 12 from above with the beam oriented toward the sheathed conductor 13.

A foremost end 15 of the clamping piece 12 is upwardly bent to serve as a tapered guide for receiving the sheathed conductor 13. Additionally, a position determining piece 16 is formed on the upper wall 10 for the sheathed conductor 13 by upwardly bending a part of the upper wall 10. The position determining piece fixes the specific position of the conductor.

Figure 7:
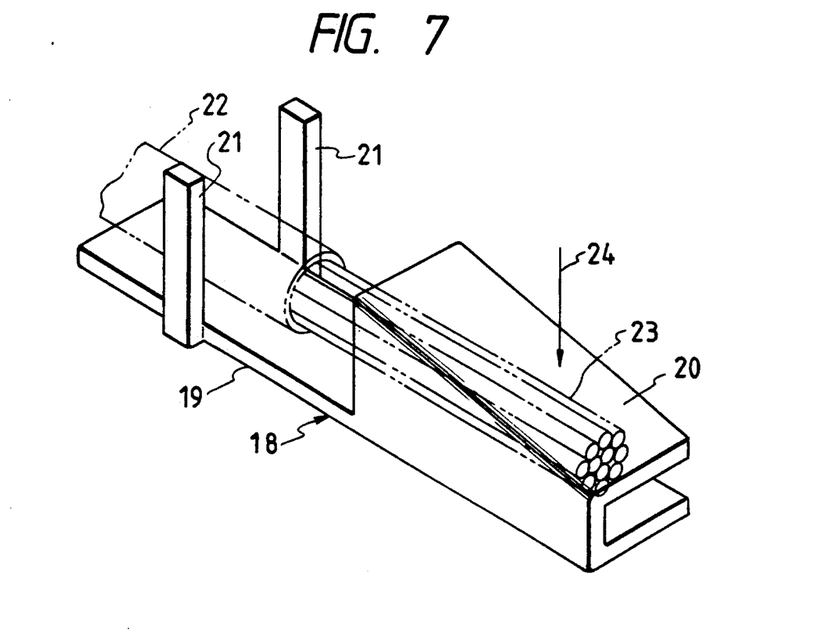
FIG. 7 is a perspective view illustrating a second embodiment of the present invention.

FIG. 7 is a perspective view of a structure employable for welding electrical connecting portions to each other in accordance with a second embodiment of the present invention wherein a contact terminal 18 is formed by welding a sheathed cable to a base plate.

The contact terminal 18 is constructed such that a forwardly sloped ceiling plate 20 is formed opposite to the base plate 19 at the fore end part of an electrically conductive metallic plate by cutting and bending it to a predetermined configuration to establish electrical contact therebetween. Additionally, a pair of cable tightening pieces 21 extend upwardly from the base plate 9 at the rear end thereof. With such construction, an exposed conductor portion 23, consisting of a bundle of wires, of a sheathed cable 22 is inserted and clamped between the ceiling portion 20 and the base plate 19. Thereafter, the ceiling portion 20, the conductor portion 23, and the base plate 19 are welded to each other by irradiating a laser light beam 24 toward the conductor portion 23 from above.

Figure 8:
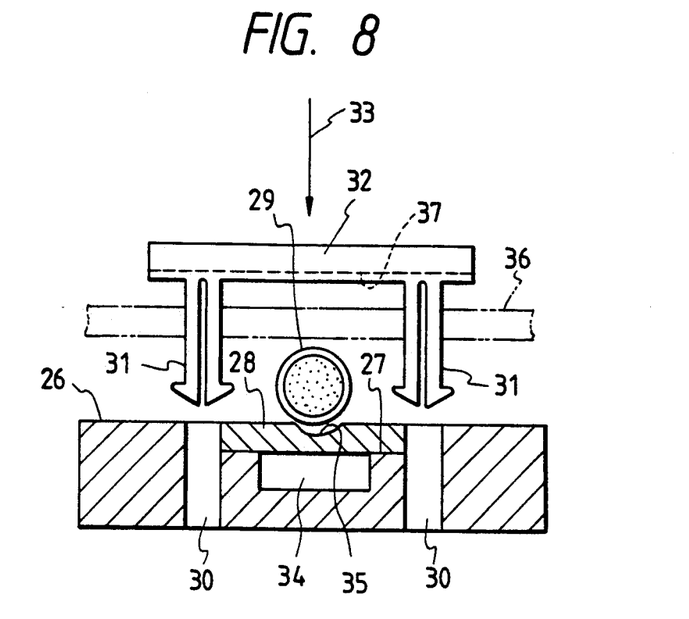
FIG. 8 is a sectional view illustrating a third embodiment of the present invention.

FIG. 8 is a sectional view illustrating a structure employable for welding electrical connecting portions to each other using a laser light beam in accordance with a third embodiment of the present invention wherein a cable is welded to electrically conductive metallic plates.

According to this embodiment of the invention, a lower electrically conductive metallic plate 28 is received in a groove 27 of a base board 26 molded of a synthetic resin or a ceramic material. A sheathed conductor 29 is then placed on the lower plate 28 and an upper electrically conductive metallic plate 32 is firmly placed on the sheathed cable 29 by engaging a pair of engagement pawls 31 of the upper plate 32 with corresponding through holes 30 in the base board 26 to clamp the sheathed conductor 29 between the upper and lower plates 32 and 28.

A recess, or hollowed portion, 34 is centrally formed in the groove 27 of the base board 26 at a position coincident with an extension line along which laser light beam 33 is irradiated on the upper metallic plate 32. In addition, a position determining groove 35 is formed on the lower electrically conductive metallic plate 28 for correctly locating the sheathed conductor 29.

It is noted that it is possible that another sheathed conductor 36 may be placed on the sheathed conductor 29 so as to intersect the ladder at a right angle so that both the sheathed conductors 29 and 36 may be welded together between the upper and lower electrically conductive metallic plates 32 and 28. In this case, it is recommended that a position determining groove 37 is formed on the bottom surface of the upper metallic plate 32.

Figure 9:
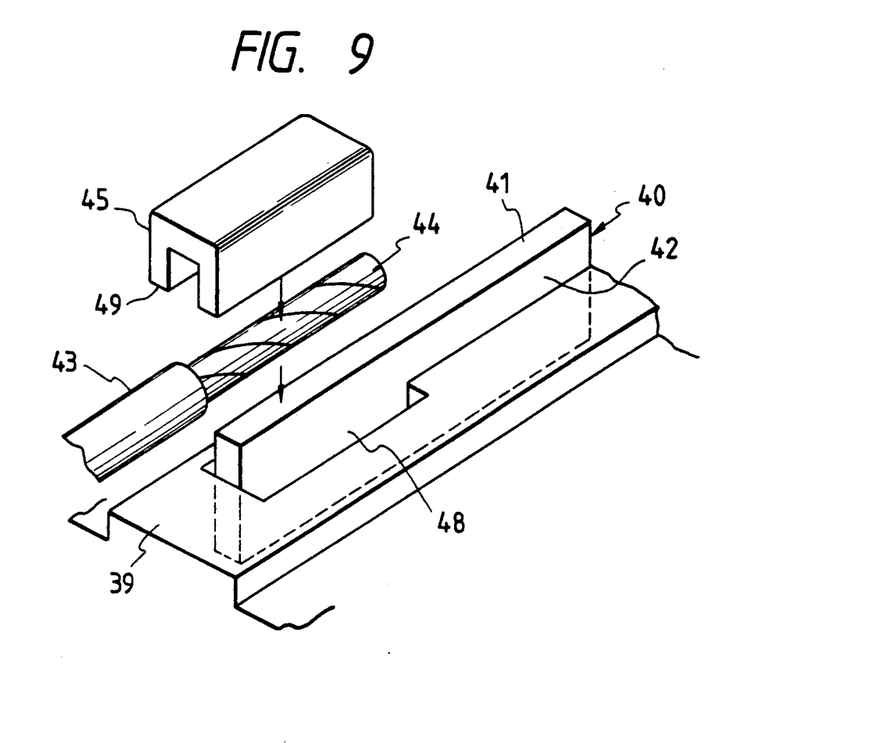
FIG. 9 is a perspective view illustrating a fourth embodiment of the present invention.
Figure 10:
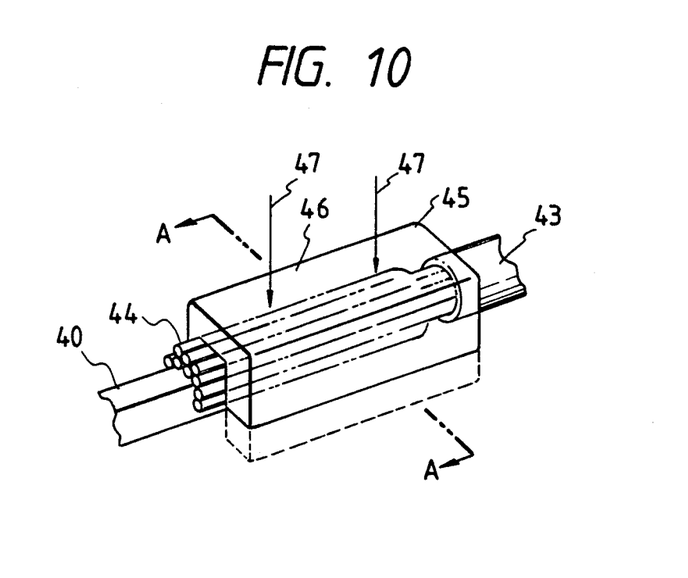
FIG. 10 is a perspective view of the structure shown in FIG. 9 with the structure being illustrated in the assembled state.
Figure 11:
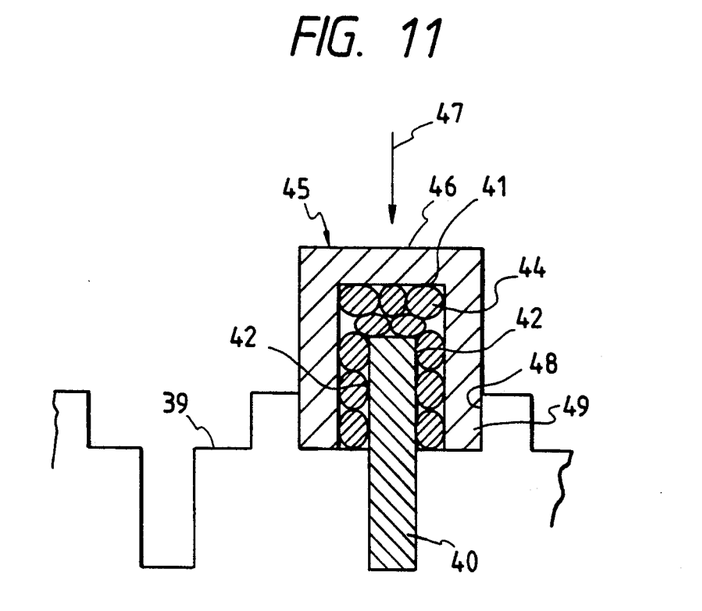
FIG. 11 is a sectional view of the structure taken along line A—A in FIG. 10.

FIGS. 9 through 11 illustrate a structure for welding electrical connecting portions to each other using a laser light beam in accordance with a fourth embodiment of the present invention wherein a longitudinally extending busbar is welded to a sheathed cable.

According to this embodiment of the invention, a longitudinally extending busbar 40 is positioned in a slot of a base board 39 so as to protrude therefrom. The base board is molded of an electrical insulating synthetic resin in the form of an electrical connection box or the like. The sheathed portion of a cable 43 is removed so as to expose the conductor portion 44, consisting of a bundle of wires. The wires of the conductor portion 44 are then uniformly distributed over an upper end surface 41 and opposite side surfaces 42 of the busbar 40, as specifically illustrated in FIGS. 10 and 11. Thereafter, an inverted U-shaped electrically conductive metallic cover 45 is placed over the wires in press-fit manner, and the electrically conductive metallic cover 45, the conductor portion 44 and the busbar 40 are welded to each other by irradiating a laser light beam 47 on an upper wall 46 of the cover 45 from above with the beam directed toward the conductor portion 44.

As a result, a portion of the electrically conductive metallic cover 45 is melted and the molten metal flows down along the busbar 40 such that the wires of the conductor portion 44 are uniformly welded to the busbar 40 and the metallic conductive metallic cover 45 with the aid of the molten metal. It is noted that the electrically conductive metallic cover 45 is correctly located by fitting a fore end part 49 of the cover 45 into an engagement groove 48 on the base board 39.

Figure 12:
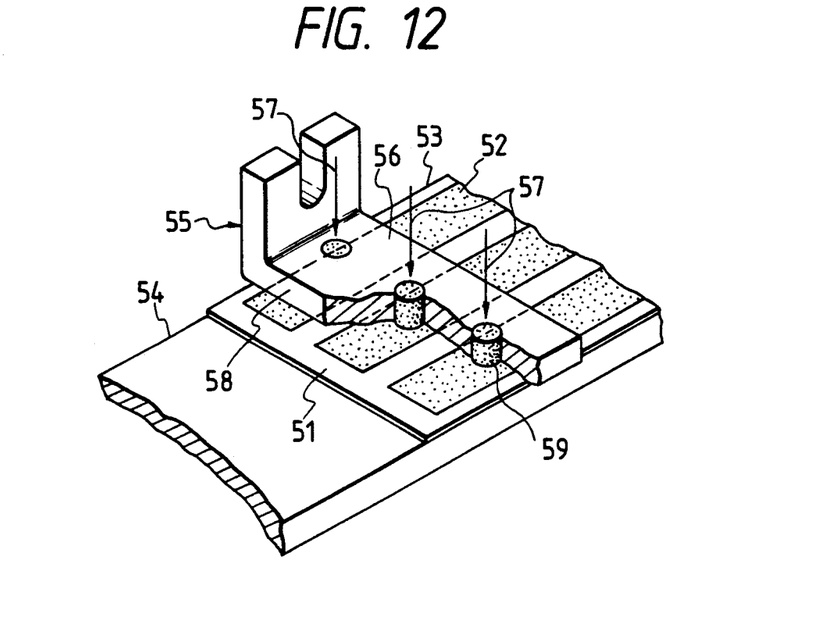
FIG. 12 is a perspective view illustrating a fifth embodiment of the present invention wherein essential components are shown in the exploded state.

FIG. 12 shows by way of a perspective view a structure employable for welding electrical connecting portions to each other using a laser light beam in accordance with a fifth embodiment of the present invention wherein a flexible printed circuit board (hereinafter referred to simply as FPC) is used as a cable to be welded.

The FPC 53 includes a plurality of circuit conductors 52 arranged in parallel with each other on the surface of a flexible sheet 51 molded of an electrical insulating synthetic resin. The FPC 53 is clamped between a busbar 54 and a base plate portion 56 of a pressure contact terminal 55. Thereafter, the base plate portion 56, the circuit conductors 52 and the busbar 54 are welded to each other by irradiating a laser light beam 57 on the base plate portion 56 from above with the beam directed toward the circuit conductors 52.

Although the circuit conductors 52 constituting the FPC 53 are dimensioned to have a very small thickness, they are heated and fused together with the base board portion 56 of the pressure contact terminal 55. In this manner the circuit conductors 52 are firmly welded to the pressure contact terminal 55 and the busbar 54 while they are clamped therebetween. When a disconnecting force is exerted on the FPC 53, the FPC 53 is bent at edge portions 58 of the base plate portion 56 to counteract against the disconnecting force in the same manner as the sheathed cable described above in the preceding embodiments. Thus, the disconnecting force is not exerted directly on welded portions 59. Accordingly, the FPC 53 has a high strength against a disconnecting force.

Figure 13:
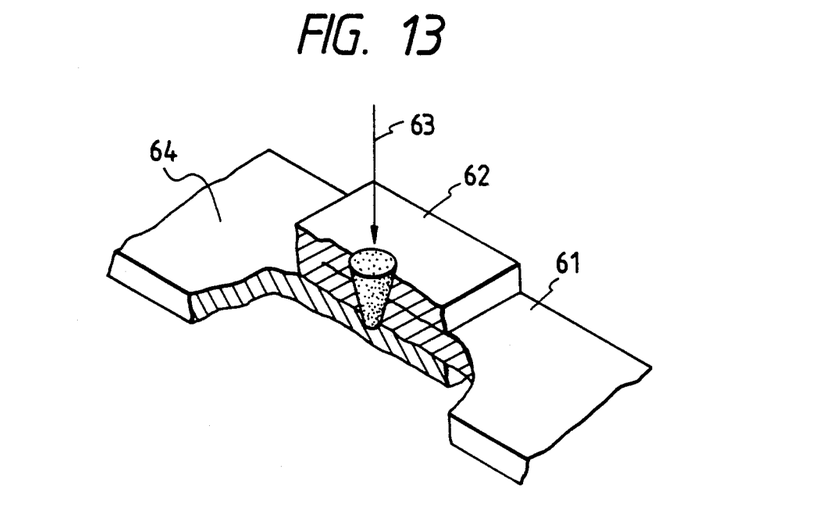
FIG. 13 is a perspective view illustrating a sixth embodiment of the present invention wherein essential components are shown in the exploded state.

FIG. 13 illustrates a structure employable for welding electrical connecting portions to each other using a laser light beam in accordance with a sixth embodiment of the present invention wherein two busbars each having a small thickness are welded to each other in an overlapped state.

In this embodiment, the fore end portion of an upper busbar 61 is folded to form a double-layered structure. Thereafter, the upper busbar 61 is welded to the folded portion 62 and to a lower busbar 64 so as to be disposed and retained therebetween by irradiating a laser light beam 63 on the folded portion 62.

Figure 14:
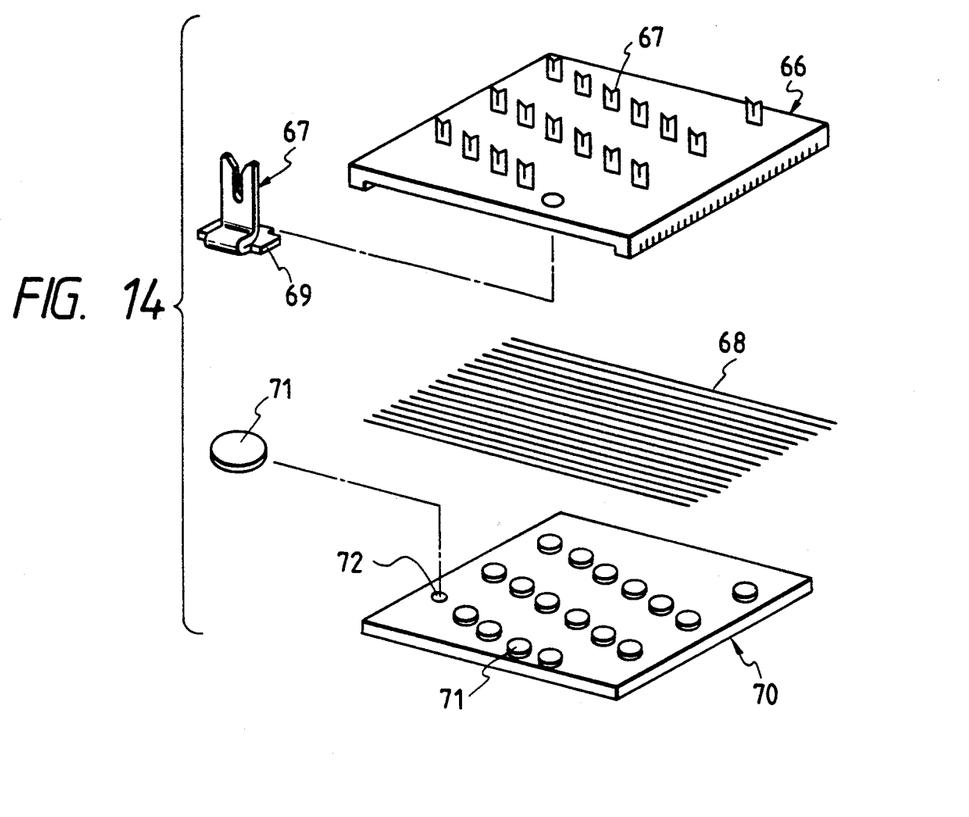
FIG. 14 is a perspective view illustrating a seventh embodiment of the present invention wherein essential components are shown in the disassembled state.
Figure 15:
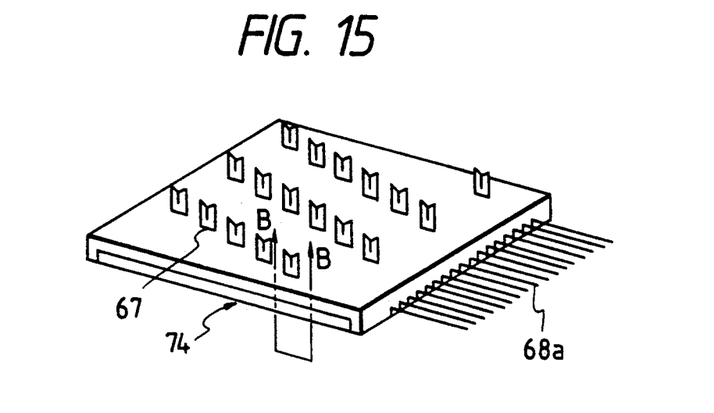
FIG. 15 is a perspective view of the structure shown in FIG. 14 with the structure being illustrated in the assembled state.
Figure 16:
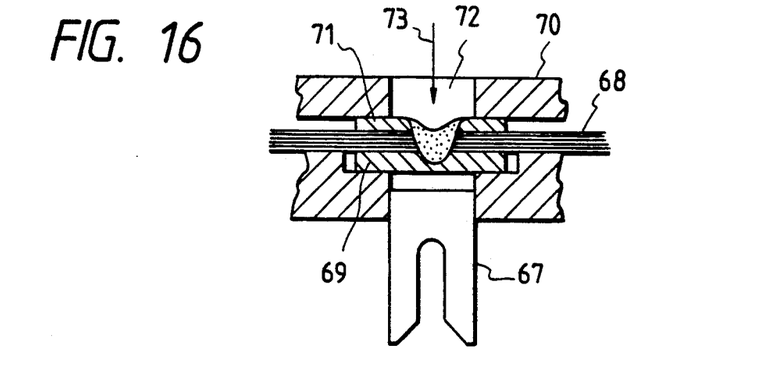
FIG. 16 is a sectional view of the structure taken along line B—B in FIG. 15 illustrating the welded state of a cable.

Finally, FIGS. 14 to 16 illustrate a structure employable for welding electrical connecting portions using a laser light beam in accordance with a seventh embodiment of the present invention wherein a plurality of sheathed conductors are welded to a pressure contact terminal to provide a relay base board for a flat circuit system.

In FIG. 14, reference numeral 66 designates a terminal board having plurality of pressure contact terminals 67 standing upright thereon, reference numeral 68 designates a plurality of sheathed conductors arranged opposite to base plates 69 of the pressure contact terminals 67, and reference numeral 70 designates a base board having a plurality of circular disc-shaped electrically conductive metallic tips 71 placed over through holes 72 while facing the sheathed conductors 68.

FIG. 15 is a perspective view which illustrates the manner in which the aforementioned components are assembled together, and FIG. 16 is a fragmentary sectional view of the assembled structure taken along line B—B in FIG. 15. Referring to FIG. 15 again, a connector (not shown), used for the purpose of connection to an external unit, is secured to a terminal end 68a of each sheathed conductor 68, and an external cable (not shown) is connected to each pressure contact terminal 67.

As shown in FIG. 16, while the sheathed conductor 68 is clamped between the base plate 69 of the pressure contact terminal 67 and the electrically conductive metallic plate 71, a laser light beam 73 is irradiated on each of the electrically conductive metallic tips 71 through the hole 72 on the base board 70 while being directed toward the sheathed conductor 68. As a result, the electric conductive metallic tip 71, the sheathed conductor 68 and the bottom plate 69 of the pressure contact terminal 67 are welded to each other. It is noted that the pressure contact terminal 67 is not connected to the sheathed conductor 68 via pressure contact but, rather, is connected by welding. Therefore, the resulting relay base board 74 is compact.

As is apparent from the above description, according to the present invention, while an electrically conductive connecting member such as a sheathed cable, a sheathed conductor, an FPC or the like is clamped between electrically conductive metallic members located opposite to each other, the electrically conductive connecting member and the electrically conductive metallic members are welded to each other by irradiating a laser light beam on one of the electrically conductive metallic members while avoiding direct irradiation of the laser light beam on the electrically conductive connecting member. Thus, the strength of the welded part can be improved without forming recesses or voids in the welded part. Even when a certain intensity of disconnecting force is exerted on the electrically conductive connecting member, the electrically conductive connecting member serves to counteract the force by bending the cable around the edge portions of the electrically conductive metallic members. Consequently, the welded part can exhibit a high strength against the disconnecting force without direct exertion of the disconnecting force on the welded portion.

What is claimed is:

1. An arrangement for establishing an electrical and mechanical connection between electrically conductive members, comprising:
   an electrically conductive connecting member;
   two electrically conductive metallic members disposed opposite each other, flanking said connecting member, and clamping said connecting member therebetween; and
   a source of laser energy oriented such that an output beam therefrom is incident on an outer surface of one of said metallic members and directed towards the underlying connecting member without being directly emitted on said connecting member to establish a weld connection at zones of mutual contact between said connecting member and said respective metallic members, wherein said electrically conductive connecting member is a cable including a plurality of wires surrounded by a sheath.

2. An arrangement for establishing an electrical and mechanical connection between electrically conductive members, comprising:
   an electrically conductive connecting member;
   two electrically conductive metallic members disposed opposite each other, flanking said connecting member, and clamping said connecting member therebetween; and
   a source of laser energy oriented such that an output beam therefrom is incident on an outer surface of one of said metallic members and directed towards the underlying connecting member without being directed towards the underlying connecting member without being directly emitted on said connecting member to establish a weld connection at zones of mutual contact between said connecting member and said respective metallic members, wherein said electrically conductive connecting member is a sheathed cable.

3. An arrangement for establishing an electrical and mechanical connection between electrically conductive members, comprising:
   an electrically conductive connecting member;
   two electrically conductive metallic members disposed opposite each other, flanking said connecting member, and clamping said connecting member therebetween; and
   a source of laser energy oriented such that an output beam therefrom is incident on an outer surface of one of said metallic members and directed towards the underlying connecting member to establish a weld connection at zones of mutual contact between said connecting member and said respective metallic members, wherein said electrically conductive connecting member is a twist.

4. An arrangement for establishing an electrical and mechanical connection between electrically conductive members, comprising:
   an electrically conductive connecting member;
   two electrically conductive metallic members disposed opposite each other, flanking said connecting member, and clamping said connecting member therebetween; and
   a source of laser energy oriented such that an output beam therefrom is incident on an outer surface of one of said metallic members and directed towards the underlying connecting member to establish a weld connection at zones of mutual contact between said connecting member and said respective metallic members, wherein said electrically conductive connecting member includes a plurality of conductors disposed on a circuit board.

5. The arrangement according to claim 1, wherein said electrically conductive metallic members are electrical terminals.

6. An arrangement for establishing an electrical and mechanical connection between electrically conductive members, comprising:
   an electrically conductive connecting member;
   two electrically conductive metallic members disposed opposite each other, flanking said connecting member, and clamping said connecting member therebetween; and
   a source of laser energy oriented such that an output beam therefrom is incident on an outer surface of one of said metallic members and directed towards the underlying connecting member to establish a weld connection at zones of mutual contact between said connecting member and said respective metallic members, wherein said electrically conductive metallic members are busbars.

7. The arrangement according to claim 6, wherein said connecting member is a sheathed conductor.

8. An arrangement for establishing an electrical and mechanical connection between electrically conductive members, comprising:
   an electrically conductive connecting member;
   two electrically conductive metallic members disposed opposite each other, flanking said connecting member, and clamping said connecting member therebetween; and
   a source of laser energy oriented such that an output beam therefrom is incident on an outer surface of one of said metallic members and directed towards the underlying connecting member to establish a weld connection at zones of mutual contact between said connecting member and said respective metallic members, wherein said one metallic member is a base member and the other of said metallic members is a contact terminal having a base portion, wherein said connecting member is a sheathed conductor disposed between said base member and said base portion, and wherein said arrangement further comprises a base plate supporting said metallic base ember and having a hole adjacent said base member through which said output beam may pass.

9. The arrangement according to claim 8, further comprising a terminal board in which said contact terminal is disposed with said base portion being exposed on one side of said terminal board and an opposite contact end of said contact terminal being exposed on an opposite side of said terminal board.

10. The arrangement according to claim 9, wherein a plurality of sets of base members, contact terminals and sheathed conductors are provided.

11. An arrangement for establishing an electrical and mechanical connection between electrically conductive members, comprising:
   an electrically conductive connecting member;
   two electrically conductive metallic members disposed opposite each other, flanking said connecting member, and clamping said connecting member therebetween; and
   a source of laser energy oriented such that an output beam therefrom is incident on an outer surface of one of said metallic members and directed towards the underlying connecting member to establish a weld connection at zones of mutual contact between said connecting member and said respective metallic members, wherein one of said metallic members includes a longitudinally extending busbar and the other of said metallic members includes a cover adapted to cover a portion of said busbar and wherein said connecting member includes a sheathed cable having a plurality of exposed wires arranged along said portion of said busbar so as to be retained between said cover and said busbar.

12. The arrangement to claim 11, wherein said busbar is rectangular in shape and said cover is U-shaped.

13. An arrangement for establishing an electrically and mechanical connection between electrically conductive members, comprising:
   an electrically conductive connecting member;
   two electrically conductive metallic members disposed opposite each other, flanking said connecting member, and clamping said connecting member therebetween; and
   a source of laser energy oriented such that an output beam therefrom is incident on an outer surface of one of said metallic members and directed towards the underlying connecting member to establish a weld connection at zones of mutual contact between said connecting member and said respective metallic members, wherein said connecting member and said metallic members are busbars, one of said metallic members comprising an outwardly folded-back portion of said connecting member.

14. A method of connecting electrical conductors to one another, comprising the following steps:
   placing a first conductor between an opposing a pair of second metallic conductors so that said first and second conductors are stacked in a beam radiating direction; and
   irradiating a laser beam on one of said pair of second conductors substantially in said beam radiating direction so that said beam is directed toward said first conductor without being emitted directly on said first conductor such that said conductors are welded together, wherein said first conductor is a conductor including a plurality of conducting wires.

15. A method of connecting electrical conductors to one another, comprising the following steps:
   placing a first conductor between an opposing pair of second metallic conductors so that said first and second conductors are stacked in a beam radiating direction; and
   irradiating a laser beam on one of said pair of second conductors substantially in said beam radiating direction so that said beam is directed toward said first conductor without being emitted directly on said first conductor such that said conductors are welded together, wherein said pair of second conductors are conductive metallic plates.

16. The method of claim 15, further comprising the step of forming said conductive metallic plates so as to be integral to each other including a base plate interconnecting said metallic plates.

17. A method of connecting electrical conductors to one another, comprising the following steps
   placing a first conductor between an opposing pair of conductive metallic plates;
   irradiating a laser beam on one of said pair of conductive metallic plates in a direction of said conductor such that said conductor and said metallic plates are welded together; and
   securing said metallic plates to one another.

18. A method of connecting electrical conductors to one another, comprising the following steps:
   placing a first conductor between an opposing pair of second metallic conductors;
   irradiating a laser beam on one of said pair of second conductors substantially in a direction of said first conductor such that said conductors are welded together; and
   arranging said first conductor on a surface of a sheet made of an insulating resin.

19. A method of connecting a first electrical conductor including a plurality of conducting wires to a second electrical conductor, comprising the following steps:
   arranging said plurality of wires around a periphery of said second conductor;
   placing a conductive metallic cover over said second conductor so as to sandwich said plurality of wires therebetween; and
   irradiating a laser beam on said cover in a direction of said plurality of wires so that a portion of said cover is melted so as to fuse said wires, said second conductor and said cover to each other.

* * * * *